(12) United States Patent
Huang et al.

(10) Patent No.: US 8,343,713 B2
(45) Date of Patent: Jan. 1, 2013

(54) METHOD FOR PATTERNING MATERIAL LAYER

(75) Inventors: Chih-Hao Huang, Hsinchu (TW); Tzong-Hsien Wu, Hsinchu (TW); Chin-Cheng Yang, Hsinchu (TW); Tien-Chu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1018 days.

(21) Appl. No.: 12/265,997

(22) Filed: Nov. 6, 2008

(65) Prior Publication Data

US 2010/0035191 A1 Feb. 11, 2010

Related U.S. Application Data

(60) Provisional application No. 61/087,172, filed on Aug. 8, 2008.

(51) Int. Cl.
*G03F 7/00* (2006.01)
(52) U.S. Cl. .......................... 430/323; 430/322; 430/317
(58) Field of Classification Search .................. 430/323, 430/322, 317
See application file for complete search history.

(56) References Cited

U.S. PATENT DOCUMENTS

| 6,556,277 B2 | 4/2003 | Pierrat |
| 6,881,524 B2 | 4/2005 | Cauchi et al. |
| 7,332,251 B2 | 2/2008 | Choi |
| 2009/0191711 A1 * | 7/2009 | Rui et al. ..................... 438/695 |

FOREIGN PATENT DOCUMENTS

| TW | 525224 | 3/2003 |
| TW | 200410308 | 6/2004 |

* cited by examiner

*Primary Examiner* — Daborah Chacko Davis
(74) *Attorney, Agent, or Firm* — J.C. Patents

(57) ABSTRACT

The invention is directed to a method for patterning a material layer. The method comprises steps of providing a material layer. The material layer has a first hard mask layer and a second hard mask layer successively formed thereon. Then, the second hard mask layer is patterned to form a plurality of openings therein. A patterned photoresist layer is formed to cover the second hard mask layer and the patterned photoresist layer exposes a portion of the openings. The first hard mask layer with the patterned photoresist layer and the patterned second hard mask layer together as a mask. Then, the patterned photoresist layer and the patterned second hard mask layer are removed. The material layer is patterned with the patterned first hard mask layer as a mask.

17 Claims, 3 Drawing Sheets

METHOD FOR PATTERNING MATERIAL LAYER

CROSS-REFERENCE TO RELATED APPLICATION

This application claims the priority benefit of U.S. provisional application Ser. No. 61/087,172, filed on Aug. 8, 2008. The entirety of the above-mentioned patent application is hereby incorporated by reference herein and made a part of this specification.

BACKGROUND OF THE INVENTION

1. Field of Invention

The present invention relates to a method for patterning a material layer. More particularly, the present invention relates to a double patterning technology for forming a random opening pattern in a material layer.

2. Description of Related Art

Due to the great demand of higher and higher integration, integrated circuit devices have to be fabricated with a smaller and smaller dimension. The photolithography process is a very crucial step that affects the dimension and performance of a semiconductor device. For example, in a metal-oxide semiconductor (MOS) device, the pattern of various thin films and the dopant regions are all determined by this photolithography step. Currently, device integration has reached a linewidth of 0.06 micron. The development of the photolithography process thus determines whether the linewidth can be approached. As a result, methods such as optical proximity correction (OPC) and phase shift mask (PSM) have been proposed and used.

Optical proximity correction is used to eliminate the deviation of critical dimension caused by the proximity effect. When a light beam penetrates through a photomask to transfer the pattern on the photomask to a wafer, the light beam incident on the wafer is diffused due to scattering. On the other hand, the light beam is reflected from the surface of the wafer to cause interference of the incident light and consequently cause a double exposure to change the actual volume of exposure.

When a pattern for being transferred onto a target material has both of the dense sub-pattern and the iso-sub-pattern, it is necessary to design various dummy patterns to be disposed aside the dense sub-pattern and the iso-sub-pattern to eliminate the exposure environment difference between the dense sub-pattern and the iso-sub-pattern. Besides, the proximity effect is high during the pattern transferring process of the pattern having has both of the dense sub-pattern and the iso-sub-pattern. Accordingly, the size of the sub-patterns is restricted by the optical limit of photolithography technology. Also, the process window for transferring such pattern is small.

SUMMARY OF THE INVENTION

Accordingly, the present invention provides a method for patterning a material layer so as to form a random opening pattern with a lower proximity effect and high depth of focus.

The present invention also provides a method for patterning a material layer capable of improving the process window.

To achieve these and other advantages and in accordance with the purpose of the invention, as embodied and broadly described herein, the invention provides a method for patterning a material layer. The method comprises steps of providing a material layer. The material layer has a first hard mask layer and a second hard mask layer successively formed thereon. Then, the second hard mask layer is patterned to form a plurality of openings therein. A patterned photoresist layer is formed to cover the second hard mask layer and the patterned photoresist layer exposes a portion of the openings. The first hard mask layer with the patterned photoresist layer and the patterned second hard mask layer together as a mask. Then, the patterned photoresist layer and the patterned second hard mask layer are removed. The material layer is patterned with the patterned first hard mask layer as a mask.

According to one embodiment of the invention, the openings are arranged to be an array.

According to one embodiment of the invention, the openings are uniformly and compactly arranged in the second hard mask layer.

According to one embodiment of the invention, the patterned photoresist layer comprises a plurality of slots therein and each slot exposes at least one of the openings.

According to one embodiment of the invention, the etching selectivity ratio of the first hard mask layer to the second hard mask layer is larger than 2.

According to one embodiment of the invention, the material of the first hard mask layer is selected from a group comprising silicon oxide, silicon nitride, titanium nitride, silicon oxy-nitride, amorphous carbon, organic material, silicon rich material, carbon rich material and polysilicon.

According to one embodiment of the invention, the material of the second hard mask layer is selected from a group comprising silicon oxide, silicon nitride, titanium nitride, silicon oxy-nitride, anti-reflection coating material, organic material, silicon rich material, carbon rich material and polysilicon.

According to one embodiment of the invention, the patterned material layer has an opening pattern formed therein and the opening pattern comprises at least an iso opening pattern and at least a dense opening pattern.

The invention also provides a method for patterning a material layer. The method comprises steps of providing a material layer. The material layer has a first hard mask layer and a second hard mask layer successively formed thereon. Then, the second hard mask layer is patterned to form a plurality of first openings therein and the first openings are arranged to form a uniform opening environment. A patterned photoresist layer is formed to cover the second hard mask layer and the patterned photoresist comprises a plurality of slots and each slot exposes at least one of the first openings. Then, the first hard mask layer is patterned with the patterned photoresist layer and the patterned second hard mask layer together as a mask. The patterned photoresist layer and the patterned second hard mask layer are removed. The material layer is patterned with the patterned first hard mask layer as a mask so that the exposed first openings are transferred into the material layer to form a plurality of second openings respectively. Also, the second openings are arranged to form a non-uniform opening environment.

According to one embodiment of the invention, the first openings are uniformly and compactly arranged in the uniform opening environment.

According to one embodiment of the invention, the first openings are arranged to be an array.

According to one embodiment of the invention, the etching selectivity ratio of the first hard mask layer to the second hard mask layer is larger than 2.

According to one embodiment of the invention, the material of the first hard mask layer is selected from a group comprising silicon oxide, silicon nitride, titanium nitride, silicon oxy-nitride, amorphous carbon, organic material, silicon rich material, carbon rich material and polysilicon.

According to one embodiment of the invention, the material of the second hard mask layer is selected from a group comprising silicon oxide, silicon nitride, titanium nitride, silicon oxy-nitride, anti-reflection coating material, organic material, silicon rich material, carbon rich material and polysilicon.

According to one embodiment of the invention, the second openings together form a random opening pattern.

According to one embodiment of the invention, the non-uniform opening environment comprises at least an iso opening pattern and at least a dense opening pattern.

According to one embodiment of the invention, the dense opening pattern comprises a plurality of second openings compactly arranged.

In the present invention, the patterned second hard mask layer provides a pattern with lower proximity effect and high depth of focus and only desired portion of the pattern is exposed by the patterned photoresist layer. Therefore, after the first hard mask layer is patterned by using the patterned photoresist layer and the patterned second hard mask layer as a mask, the patterned first hard mask layer has a random opening pattern is formed with lower proximity effect and high depth of focus. Accordingly, the result pattern in the material layer is also a random opening pattern formed without being affected by the proximity effect and the shapes of the openings in the material layer are also maintained without compromised. Thus, the process window for forming the random opening pattern in the material layer is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
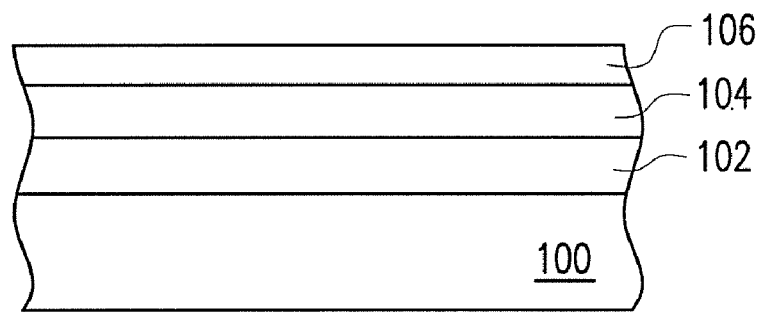
FIGS. 1A through 1F are cross-sectional views showing a method for patterning a material layer according to one embodiment of the invention.

As shown in FIG. 1A, a substrate 100 is provided. A material layer 102 is formed on the substrate 100. The material layer 102 can be, for example but not limited to, made from silicon oxide by chemical vapor deposition. Then, a first hard mask layer 104 is formed on the material layer 102. A second hard mask layer 106 is formed on the first hard mask layer 104. The etching selectivity ratio of the first hard mask layer to the second hard mask layer is larger than 2. The material of the first hard mask layer 104 can be, for example but not limited to, selected from a group comprising silicon oxide, silicon nitride, titanium nitride, silicon oxy-nitride, amorphous carbon, organic material, silicon rich material, carbon rich material and polysilicon. Also, the material of the second hard mask layer 106 is selected from a group comprising silicon oxide, silicon nitride, titanium nitride, silicon oxy-nitride, anti-reflection coating material, organic material, silicon rich material, carbon rich material and polysilicon.

In this embodiment of the present invention, the first hard mask layer 104 and the second hard mask layer 106 are single-layered material layers respectively. However, the present invention is not limited to the structure of each of the first hard mask layer 104 and the second hard mask layer 106. Therefore, the first hard mask layer 104 can be a multi-layered mask layer and the second hard mask layer 106 can be a multi-layered mask layer as long as the etching selectivity of the first hard mask layer 104 is different from that of the second hard mask layer 106. Further, there can be a material layer interposed between the first hard mask layer 104 and the second hard mask layer 106 to be an etching stop layer while the second hard mask layer 106 is patterned in later process steps.

Figure 1B:
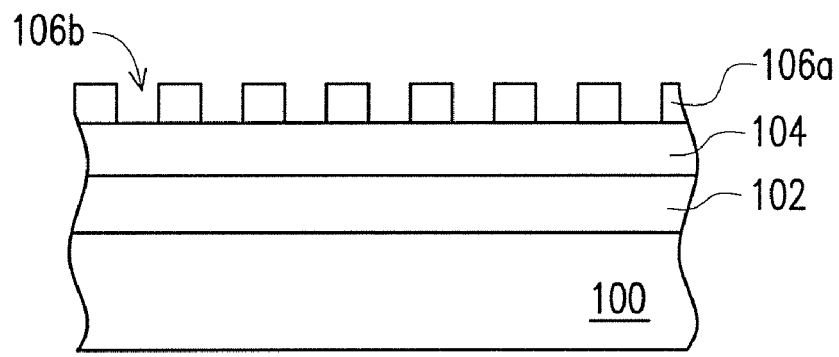
Figure 2:
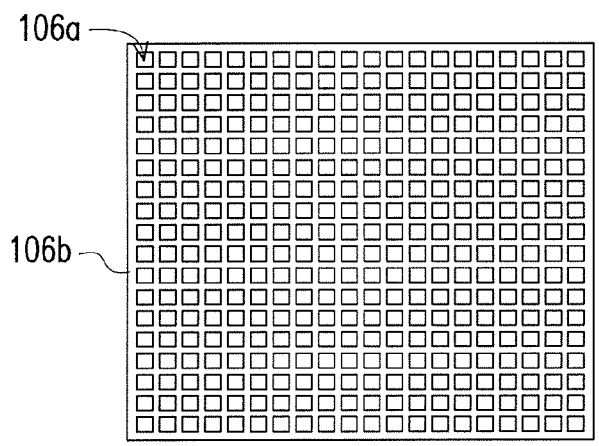
FIG. 2 is a top view of a second hard mask layer shown in FIG. 1B.

As shown in FIG. 1B, the second hard mask layer 106 is patterned to form a second hard mask layer 106a. The second hard mask layer 106a comprises a plurality of openings 106b formed therein. The method for patterning the second hard mask layer 106 comprises steps of forming a patterned photoresist layer (not shown) on the second hard mask layer 106 and performing an etching process to transfer a pattern in the patterned photoresist layer into the second hard mask layer 106. It should be noticed that, as shown in FIG. 2, the openings 106b are uniformly and compactly arranged in the patterned second hard mask layer 106a. Also, the pitch of the pattern composed of the openings 106b is uniform. Therefore, the openings 106b are arranged to form a uniform opening environment in which the types of the sub-patterns (the openings 106b) are unify. Furthermore, the openings 106b can be, for example but not limited to, arranged to be an array. That means the pattern having the compactly and uniformly arranged openings 106a in the second hard mask layer 106 is obtained from performing a photolithography process with a lower proximity effect and a higher depth of focus. Therefore, the shape of each of the openings 106b is maintained without being affected by the pattern transferring process.

Figure 1C:
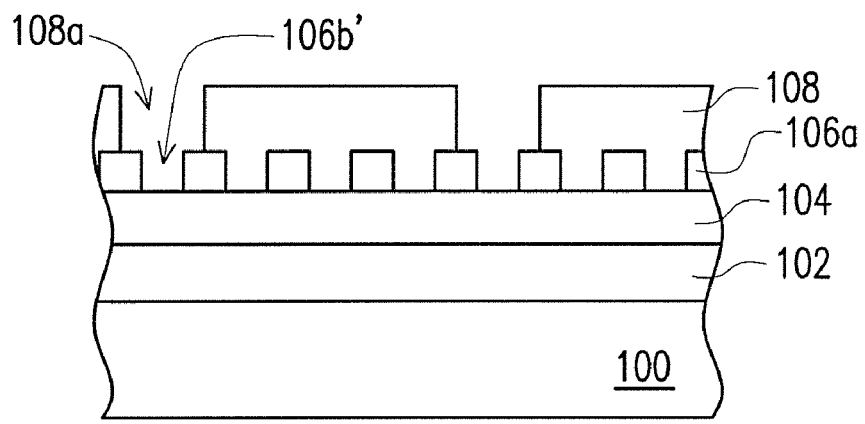
Figure 3:
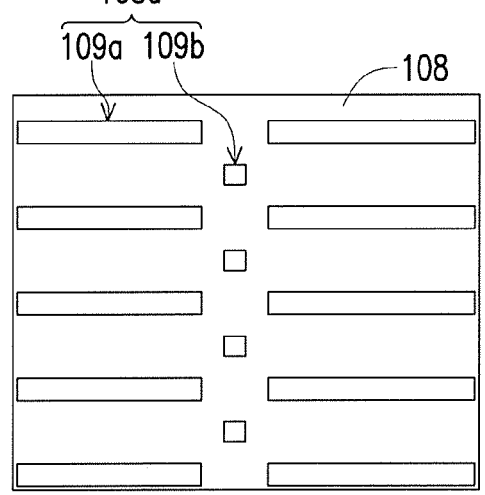
FIG. 3 is a top view of a patterned photoresist layer shown in FIG. 1C.

As shown in FIG. 1C, a patterned photoresist layer 108 is formed to cover the second hard mask layer 106a and the patterned photoresist layer 108 exposes a portion of the openings 106b. The exposed openings 106b in the second hard mask layer 106 are re-labeled as openings 106b'. The patterned photoresist layer 108 comprises a plurality of slots 108a formed therein and each slot 108a exposes at least one of the openings 106b. On the other words, as shown in FIG. 3, the slots 108a in the patterned photoresist layer 108 are grouping into at least two types. One is the slot, such as slot 109a, exposes several openings 106b', which are compactly arranged, at the same time. The other is the slot, such as slot 109b, only exposes one opening 106b'. That is, the slot 109a exposes the compactly and uniformly arranged openings 106b' so that the exposed openings 106b' in the slot 109a together form a dense pattern. Furthermore, the slot 109b exposes only one opening 106b' and the openings 106b in the second hard mask layer 106 around the exposed opening 106b' are covered so that the exposed opening 106b' in the slot 109b is an iso-pattern itself. It should be noticed that the size of each of the slot 109a is larger than the total size of the openings 106b' exposed by the slot 109a so that the slot 109a can fully expose the dense pattern in which the openings 106b' are uniformly and compactly arranged. Similarly, the size of each of the slot 109b is larger than the size of the opening 106' so that the slot 109b fully exposes the opening 106b.

Figure 1D:
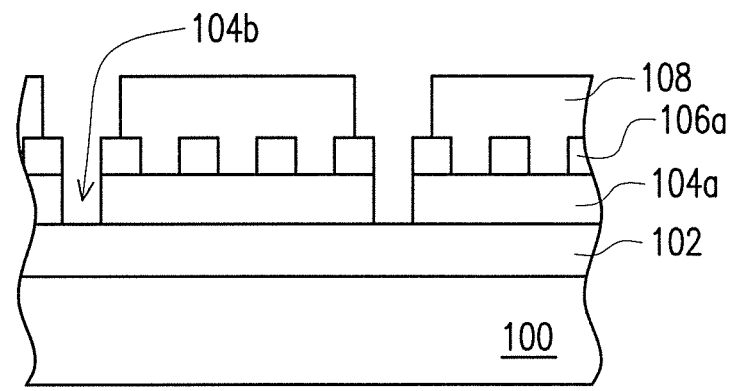

As shown in FIG. 1D, the first hard mask layer 104 is patterned to form a patterned first hard mask layer 104a having a plurality of openings 104b by using the patterned photoresist layer 108 and the patterned second hard mask layer 106a as a mask. Accordingly, the openings 104b are arranged to form a non-uniform opening environment. It should be noticed that, the openings 106b in the second hard mask layer 106a exposed by the slots 108a in the patterned photoresist layer 108 are transferred into the first hard mask layer 104. That is, the pattern in the patterned first hard mask layer 104a comprises both dense patterns and iso-patterns, which gives the non-uniform opening environment.

Figure 1E:
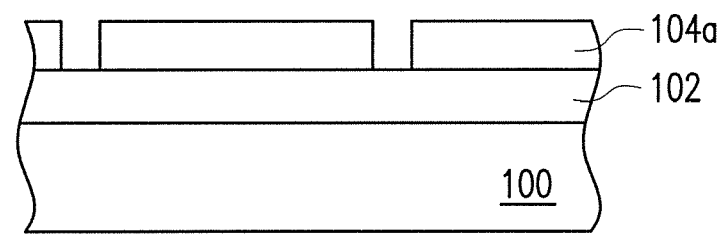
Figure 1F:
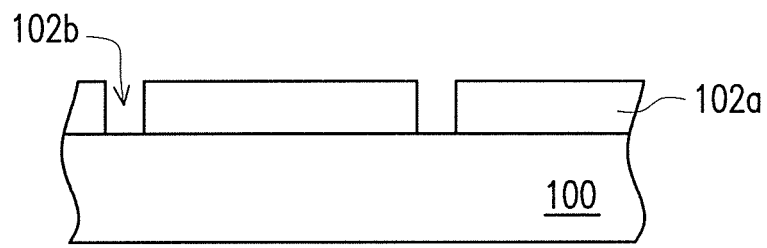
Figure 4:
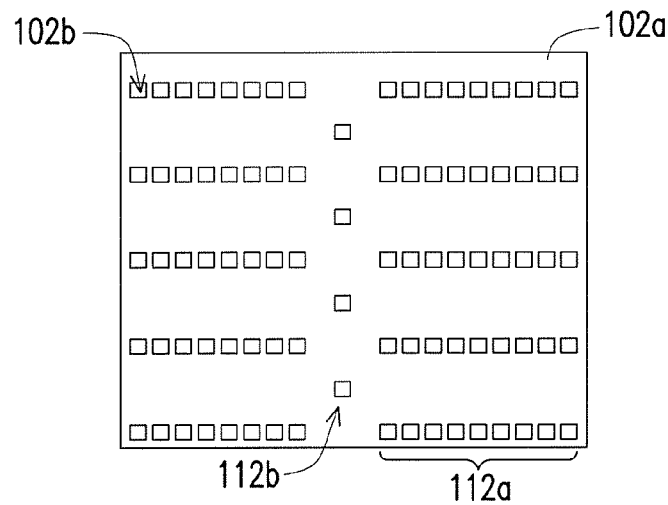
FIG. 4 is a top view of the patterned material layer shown in FIG. 1F.

As shown in FIG. 1E, the patterned photoresist layer 108 and the patterned second hard mask layer 106a are removed. As shown in FIG. 1F, the material layer 102 is patterned to form a plurality of the openings 102b therein by using the patterned first hard mask layer 104a as a mask. Then, the patterned first hard mask layer 104a is removed. The openings 102b can be, for example but not limited to, contact holes or vias. The patterns composed of the openings 104b in the first hard mask layer 104a is copied into the material layer 102a as a pattern composed of openings 102b. Therefore, the openings 102b are also arranged to form a non-uniform opening environment, in which the pattern in the patterned material layer 102a comprises at least one dense pattern 112a, in which the openings 102b are compactly arranged, and at least one iso-pattern 112b, as shown in FIG. 4. On the other words, the openings 102b in the patterned material layer 102a construct a random opening pattern.

In the present invention, a double patterning method is illustrated. In the first patterning process, in the topmost hard mask layer, a pattern with compactly and uniformly arranged openings is formed with lower proximity effect and higher depth of focus so that the shape of each sub-pattern is maintain without being compromised and the pitch size of the pattern would not limited by the optical limit of photolithography technology. Accordingly, the size of each opening of the pattern in the topmost hard mask layer can be pushed to below 70 nm*70 nm. Furthermore, the patterned photoresist layer with slots formed therein covers the topmost hard mask layer and exposes the desired openings in the topmost hard mask layer for further being transferred into the target material layer.

In the second patterning process, the bottom hard mask layer is patterned by using the patterned photoresist layer and the topmost hard mask layer as a mask. Therefore, the openings with lower proximity effect and exposed by the slot of the patterned photoresist layer are copied into the bottom hard mask layer and further copied into the target material layer under the bottom hard mask layer. The topmost hard mask layer not only has the pattern with lower proximity effect but also is used as an etching mask for further transferring the partial pattern into the bottom hard mask layer. Since the pattern with lower proximity effect is previously formed in the topmost hard mask layer and is partially covered by the patterned photoresist layer in the later process step, the result pattern, which is composed of a portion of the openings in the topmost hard mask layer exposed by the patterned photoresist, formed in the target material layer can be a random opening pattern without being affected by the proximity effect and poor depth of focus. Therefore, the process windows for forming the random opening pattern in the target material layer is expanded.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for patterning a material layer, comprising:
providing a material layer, wherein the material layer has a first hard mask layer and a second hard mask layer successively formed thereon;
patterning the second hard mask layer to form a plurality of openings in the second hard mask layer;
forming, after the second hard mask layer is patterned, a patterned photoresist layer over the second hard mask layer, wherein the patterned photoresist layer exposes a portion of the openings;
patterning the first hard mask layer with the patterned photoresist layer and the patterned second hard mask layer together as a mask;
removing the patterned photoresist layer and the patterned second hard mask layer; and
patterning the material layer with the patterned first hard mask layer as a mask.

2. The method of claim 1, wherein the openings are arranged to be an array.

3. The method of claim 1, wherein the openings are uniformly and compactly arranged in the second hard mask layer.

4. The method of claim 1, wherein the patterned photoresist layer comprises a plurality of slots therein and each slot exposes at least one of the openings.

5. The method of claim 1, wherein the etching selectivity ratio of the first hard mask layer to the second hard mask layer is larger than 2.

6. The method of claim 1, wherein the material of the first hard mask layer is selected from a group consisting of silicon oxide, silicon nitride, titanium nitride, silicon oxy-nitride, amorphous carbon, organic material, silicon rich material, carbon rich material and polysilicon.

7. The method of claim 1, wherein the material of the second hard mask layer is selected from a group consisting of silicon oxide, silicon nitride, titanium nitride, silicon oxy-nitride, anti-reflection coating material, organic material, silicon rich material, carbon rich material and polysilicon.

8. The method of claim 1, wherein the patterned material layer has an opening pattern formed therein and the opening pattern comprises at least an iso opening pattern and at least a dense opening pattern.

9. A method for patterning a material layer, comprising:
providing a material layer, wherein the material layer has a first hard mask layer and a second hard mask layer successively formed thereon;
patterning the second hard mask layer to form a plurality of first openings in the second hard mask layer, wherein the first openings are arranged to form a uniform opening environment;
forming, after the second hard mask layer is patterned, a patterned photoresist layer over the second hard mask layer, wherein the patterned photoresist comprises a plurality of slots and each slot exposes at least one of the first openings;
patterning the first hard mask layer with the patterned photoresist layer and the patterned second hard mask layer together as a mask;

removing the patterned photoresist layer and the patterned second hard mask layer; and patterning the material layer with the patterned first hard mask layer as a mask so that the exposed first openings are transferred into the material layer to form a plurality of second openings respectively, wherein the second openings are arranged to form a non-uniform opening environment.

10. The method of claim 9, wherein the first openings are uniformly and compactly arranged in the uniform opening environment.

11. The method of claim 9, wherein the first openings are arranged to be an array.

12. The method of claim 9, wherein the etching selectivity ratio of the first hard mask layer to the second hard mask layer is larger than 2.

13. The method of claim 9, wherein the material of the first hard mask layer is selected from a group consisting of silicon oxide, silicon nitride, titanium nitride, silicon oxy-nitride, amorphous carbon, organic material, silicon rich material, carbon rich material and polysilicon.

14. The method of claim 9, wherein the material of the second hard mask layer is selected from a group consisting of silicon oxide, silicon nitride, titanium nitride, silicon oxy-nitride, anti-reflection coating material, organic material, silicon rich material, carbon rich material and polysilicon.

15. The method of claim 9, wherein the second openings together form a random opening pattern.

16. The method of claim 9, wherein the non-uniform opening environment comprises at least an iso opening pattern and at least a dense opening pattern.

17. The method of claim 16, wherein the dense opening pattern comprises a plurality of second openings compactly arranged.

* * * * *